United States Patent [19]

Park et al.

[11] Patent Number: 4,876,635

[45] Date of Patent: Oct. 24, 1989

[54] SERIES RESONANT INVERTER WITH LOSSLESS SNUBBER-RESETTING COMPONENTS

[75] Inventors: John N. Park, Rexford; Robert L. Steigerwald, Burnt Hills; Michael J. Schutten, Schenectady, all of N.Y.

[73] Assignee: General Electric Company, Schenectady, N.Y.

[21] Appl. No.: 288,909

[22] Filed: Dec. 23, 1988

[51] Int. Cl.[4] ............... H02M 3/337; H02M 7/5387
[52] U.S. Cl. .................................. 363/17; 363/56; 363/132
[58] Field of Search ............ 363/17, 56, 80, 98, 363/132, 28, 136

[56] References Cited

U.S. PATENT DOCUMENTS

| | | |
|---|---|---|
| 4,477,868 | 10/1984 | Steigerwald ............... 363/17 |
| 4,541,041 | 9/1985 | Park et al. ............... 363/17 |
| 4,566,059 | 1/1986 | Gallios et al. ............... 363/17 |
| 4,672,528 | 6/1987 | Park et al. ............... 363/17 |
| 4,685,041 | 8/1987 | Bowman et al. ............... 363/40 |
| 4,814,962 | 3/1989 | Magalhaes et al. ............... 363/17 |

Primary Examiner—William H. Beha, Jr.
Attorney, Agent, or Firm—Jill M. Breedlove; James C. Davis, Jr.; Marvin Snyder

[57] ABSTRACT

A circuit for "resetting" snubbers in a series resonant bridge inverter maintains lossless snubber action during light-load and no-load inverter operation and during operation near resonance. Series resonant circuit operation is controlled to be above the resonant frequency to ensure operation at a lagging power factor. The snubber-resetting operation is facilitated by a relatively small inductor connected across the output terminals of the series resonant inverter.

9 Claims, 2 Drawing Sheets

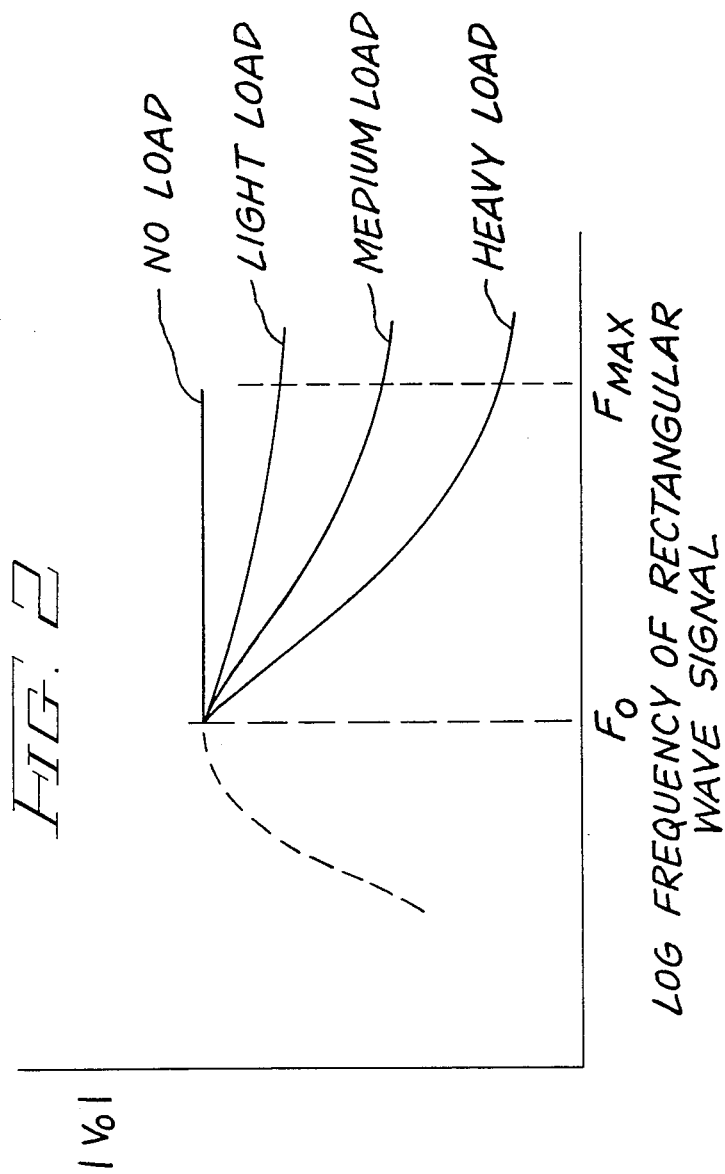

SERIES RESONANT INVERTER WITH LOSSLESS SNUBBER-RESETTING COMPONENTS

FIELD OF THE INVENTION

The present invention relates generally to series resonant inverters. More particularly, this invention relates to apparatus for maintaining lossless snubber action during no-load and light-load operating conditions and during operation near resonance in high power, high frequency series resonant bridge inverters.

BACKGROUND OF THE INVENTION

Operating inverters with a resonant circuit is attractive since sinusoidal currents and voltages can be achieved, and since inverter switching devices can operate with low switching losses. Another advantage of using resonant inverters is the potential for obtaining reduced electromagnetic interference due to the low harmonic content of the sinusoidal current and voltages.

Such inverters generally require a stress-relieving circuit, or snubber, connected across each of the power semiconductor switching devices. Snubbers function to: control the rate-of-rise of voltage and current; reduce switching losses of the power semiconductor devices; suppress overvoltages; abate noise and electromagnetic interference; and avoid secondary breakdown of the power semiconductor devices.

For inverters operating with a load having a leading power factor, such as thyristor inverters, both turn-on and turn-off snubbers are generally required. However, when the load on the inverter is running at a lagging power factor, device current waveforms for inverters comprised of transistors are more retarded in phase relative to the output voltage of the inverter than those of thyristor inverters. A lagging power factor is ensured for series resonant operation above the resonant frequency. Under normal load conditions at a lagging power factor, current is transferred from each switching device to its respective anti-parallel feedback diode and/or integral parasitic feedback diode prior to turning on the switching device. Hence, for such operating conditions, there are no turn-on switching losses in the power semiconductor switches. However, there are turn-off switching losses which can be reduced by connecting a simple snubber capacitor directly across each switching device. Since no energy is stored in the shunt capacitive snubber after the power semiconductor switch in parallel therewith has switched on, there is no need for a current limiting resistor or a parallel-connected diode-resistor combination in series with each capacitor. The result is lossless snubber action and, therefore, low semiconductor switch power dissipation and low voltage overshoots at device turn-off.

In series resonant circuit operation, there is a switch commutation delay between switching the circuitry in diagonally opposed corners of a bridge inverter. The lossless snubber capacitors limit the rise and fall times of the typical square wave voltage driving the resonant tank circuit. Disadvantageously, however, under no-load or light-load conditions, the available load current is generally insufficient to "reset", or discharge, the snubber capacitors during the power switch commutation delay, and lossless snubber action is compromised.

OBJECT OF THE INVENTION

It is, therefore, an object of the present invention to provide a new and improved resonant bridge inverter which maintains lossless snubber action during light-load and no-load conditions and during operation near the resonant frequency.

SUMMARY OF THE INVENTION

In accordance with a preferred embodiment of the invention, a resonant bridge inverter having circuit means for maintaining lossless snubber action during no-load and light-load conditions and during resonant operation employs a relatively small, low-loss inductor connected across the inverter bridge output terminals. Under the aforementioned operating conditions, the added inductor results in sufficient current being drawn to fully discharge each snubber capacitor before its respective power switching device turns on, thereby maintaining lossless snubber action.

The features and advantages of the present invention will become apparent from the following detailed description of the invention when read with accompanying drawings.

BRIEF DESCRIPTION OF THE DRAWINGS

FIG. 2 is a graphical illustration showing the magnitude of output voltage plotted against the log of frequency of rectangular wave voltage supplied to the series resonant circuit employed in the DC-to-DC converter of FIG. 1 for heavy-load, medium-load, light-load and no-load conditions.

DETAILED DESCRIPTION OF THE INVENTION

Figure 1:
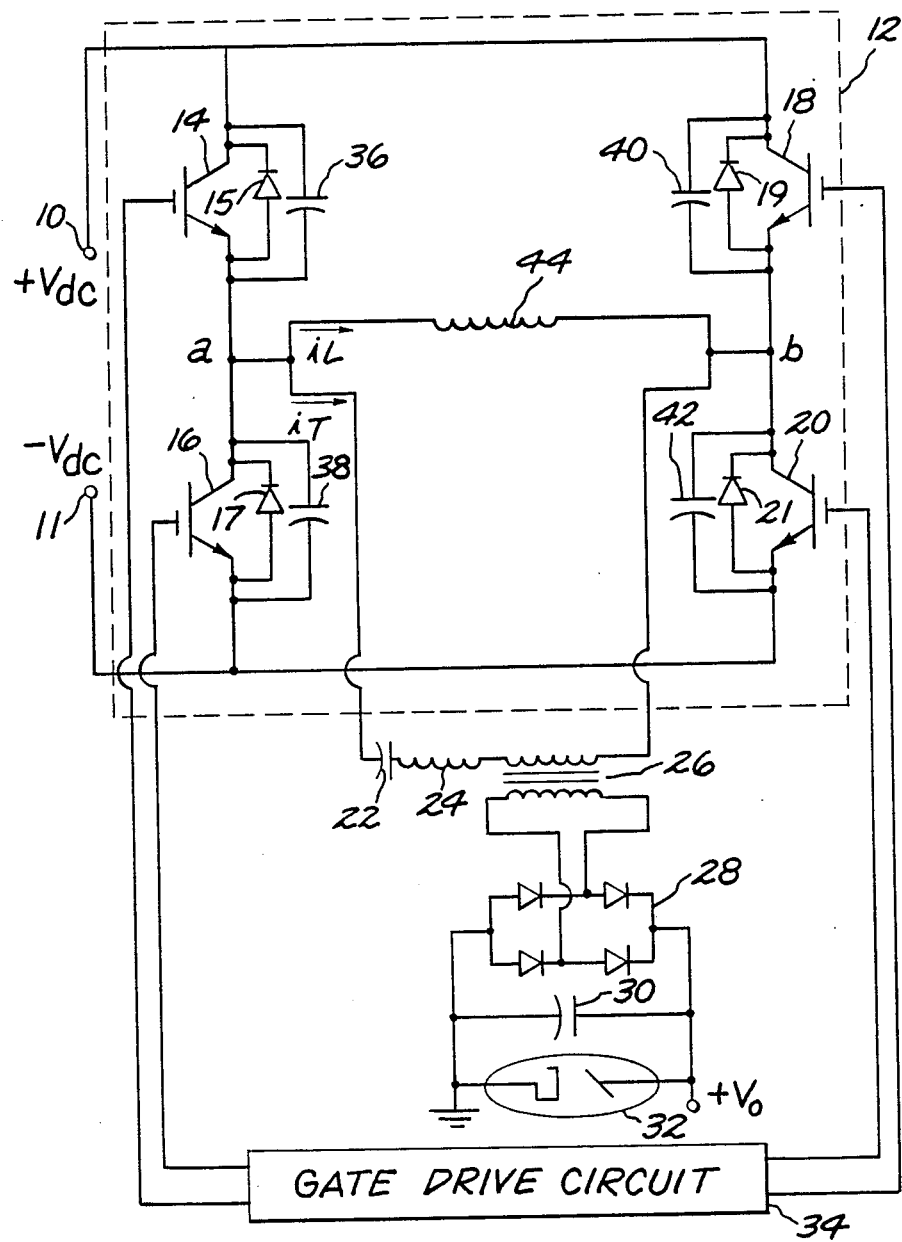
FIG. 1 is a circuit diagram illustrating a DC-to-DC converter employing a series resonant inverter in accordance with the present invention.

With reference to FIG. 1, a resonant DC-to-DC converter employing the resonant inverter of the present invention is shown. An external source (not shown) provides input DC power at terminals 10 and 11. Connected across terminals 10 and 11 is a full bridge inverter 12. Inverter 12 includes four switching devices that are capable of carrying reverse current and capable of being turned off by a switching signal. The switching devices of the preferred embodiment are insulated-gate bipolar junction transistors (IGBT's) 14, 16, 18 and 20, the reverse current for each transistor being carried by an anti-parallel diode 15, 17, 19 and 21, respectively. Other switching devices with gate turn-off capability could be used instead of the IGBT's, such devices either having parallel-connected diodes and/or integral parasitic diodes for carrying reverse current. For example, a field effect transistor, which has an integral parasitic diode, could be used. The output of inverter 12 is available across junctions a and b between series-connected transistors 14 and 16 and between series-connected transistors 18 and 20, respectively.

Connected between junctions a and b is a series resonant circuit comprising a capacitor 22, an inductor 24, and the primary winding of a transformer 26. The secondary winding of transformer 26 is connected to the input of full wave rectifier 28. The output of full wave rectifier 28 is connected in parallel with filter capacitor 30 and an output load shown in FIG. 1 as an x-ray tube 32 across which the converter output voltage $V_o$ is produced.

Gate drive circuit 34, well-known in the art, switches the circuitry in diagonally opposed corners of the inverter, resulting in square waves of voltage $V_{ab}$ being supplied to the resonant circuit connected across points a and b in the circuit of FIG. 1. The square wave voltage produces a sinusoidal current waveform due to the action of the resonant circuit. Full wave rectification and filtering of the sinusoidal current being supplied to rectifier 28 and capacitor 30, respectively, result in a substantially smooth DC output voltage $V_o$ which can be maintained constant over an operable range of inverter output frequencies.

The resonant circuit is driven at a frequency such that a lagging load is presented to the inverter between points a and b; that is, the current $i_L + i_T$ (indicated by direction of flow arrows in FIG. 1) lags the voltage $V_{ab}$, and the IGBT's are turned off by gate control rather than by anode current commutation. As shown, $i_L$ represents the current in an inductor 44 connected between points a and b, the operation of which is to be described hereinafter; and $i_T$ represents the current supplied to the resonant tank circuit. The lagging load is obtained by operating the inverter at frequencies above the resonant frequency of the circuit.

As illustrated in FIG. 1 and as hereinbefore described, lossless snubbers comprise capacitors 36, 38, 40 and 42 coupled across IGBT's 14, 16, 18 and 20, respectively, to reduce turn-off dissipation of power.

The resonant nature of the output load voltage of inverter 12 is shown graphically in FIG. 2, wherein the magnitude of the output load voltage $V_o$ is plotted as a function of the log of the frequency of the square wave voltage signal $V_{ab}$ across the series resonant circuit. For proper power switch commutation, operation above the natural resonant frequency $F_o$ is necessary for gated devices, such as the illustrated IGBT's 14, 16, 18, and 20. However, there is a maximum frequency $F_{max}$ beyond which these switching devices will fail to operate satisfactorily. Thus, an oprable frequency range of the switching devices is defined as that frequency range between $F_o$ and $F_{max}$.

Under normal output load conditions, i.e. operation with a medium or a heavy load, there is sufficient current through the series resonant circuit to maintain the above-discussed lossless snubbing action during inverter commutation. In contrast, under light-load or no-load conditions or during circuit operation near resonance, there may be insufficient current through the resonant circuit to fully discharge the respective snubber capacitors during the commutation delay. As a result, the capacitors can discharge substantial residual charge through the respective switching devices at device turn-on. Switching losses thereby occur, and lossless snubbing action is not achieved.

According to the preferred embodiment of the present invention, in order to maintain lossless snubbing action during the commutation delay, a relatively small inductor 44 is connected across the output terminals a and b of the series resonant circuit. Referring to FIG. 1, operation of this circuit according to the present invention will now be described. With devices 14 and 20 turned on by gate control circuit 34, snubber capacitors 38 and 40 charge to the positive rail voltage $+V_{dc}$ through devices 14 and 20, respectively. Immediately upon being turned off by the gate control circuit, the IGBT's 14 and 20 block voltage, and snubber capacitors 38 and 40 discharge through the parallel combination of the resonant tank circuit and inductor 44 until anti-parallel diodes 17 and 19 become forward biased. Thus, the addition of inductor 44 results in sufficient current, $i_T + i_L$, to completely discharge snubber capacitors 38 and 40 during the commutation delay, even when $i_T$ is small, before gate control circuit 34 switches on IGBT's 16 and 18. In this way, at turn-on of IGBT's 16 and 18, capacitors 38 and 40 will not discharge through IGBT's 16 and 18, respectively, and lossless snubbing action is achieved, even under no-load and light-load conditions or during operation near resonance.

While the preferred embodiments of the present invention have been shown and described herein, it will be obvious that such embodiments are provided by way of example only. Numerous variations, changes and substitutions will occur to those skilled in the art without departing from the invention herein. Accordingly, it is intended that the invention be limited only by the spirit and scope of the appended claims.

What is claimed is:

1. An improved series resonant bridge inverter, comprising:
   two pairs of controllable switch means, the switch means of each pair being connected in series and each pair of series-connected switch means being adapted to be connected in parallel across a DC supply;
   a series resonant circuit connected between the junctions of the controllable switch means in each pair of controllable switch means and comprising a capacitor and an inductor, said series resonant circuit further having means for coupling the output of the resonant inverter to a load, said controllable switch means providing a rectangular wave signal to said resonant circuit;
   a snubber capacitor coupled across each of said controllable switch means; and
   circuit means coupled to said series resonant circuit for drawing sufficient current to ensure that each said snubber capacitor is discharged before turning on the respective switch means coupled thereacross.

2. The inverter of claim 1 wherein said circuit means comprises a snubber-resetting inductor connected in parallel across said series resonant circuit.

3. The inverter of claim 1 wherein said controllable switch means comprises an insulated-gate bipolar junction transistor connected in anti-parallel with a diode.

4. The inverter of claim 1 wherein said controllable switch means comprises a field effect transistor.

5. An improved DC-to-DC converter, comprising:
   a series resonant inverter having two pairs of controllable switch means, the switch means of each pair being connected in series and each pair of series-connected switch means being adapted to be connected in parallel across a DC supply;
   a series resonant circuit connected between the junctions of the controllable switch means in each pair of controllable switch means and comprising a capacitor and an inductor, said controllable switch means providing a rectangular wave signal to said resonant circuit;
   a snubber capacitor coupled across each of said controllable switch means;
   circuit means coupled to said series resonant circuit for drawing sufficient current to ensure that each said snubber capacitor is discharged before turning on the respective switch means coupled thereacross; and a full wave rectifier coupled to said series resonant circuit, the output of said rectifier being adapted to apply substantially constant output voltage to a load.

6. The converter of claim 5 wherein said circuit means comprises a snubber-resetting inductor connected in parallel across said series resonant circuit.

7. The converter of claim 5 wherein said controllable switch means comprises an insulated-gate bipolar junction transistor connected in anti-parallel with a diode.

8. The converter of claim 5 wherein said controllable switch means comprises a field effect transistor.

9. The converter of claim 5 wherein said series resonant circuit includes transformer means coupling said full wave rectifier to said series resonant circuit, said transformer means including a primary winding connected in series with said series resonant circuit.

* * * * *